United States Patent [19]
Forbes

[11] Patent Number: 6,043,527
[45] Date of Patent: Mar. 28, 2000

[54] CIRCUITS AND METHODS FOR A MEMORY CELL WITH A TRENCH PLATE TRENCH CAPACITOR AND A VERTICAL BIPOLAR READ DEVICE

[75] Inventor: Leonard Forbes, Corvallis, Oreg.

[73] Assignee: Micron Technology, Inc., Boise, Id.

[21] Appl. No.: 09/060,048

[22] Filed: Apr. 14, 1998

[51] Int. Cl.[7] .......................... H01L 27/108; H01L 29/16; H01L 29/94; H01L 31/119
[52] U.S. Cl. .......................... 257/296; 257/300; 257/302; 365/149; 365/177; 365/225.6
[58] Field of Search ..................... 257/296, 298, 257/300, 302, 273, 277, 370, 378; 365/149, 177, 174, 225.6

[56] References Cited

U.S. PATENT DOCUMENTS

| | | | |
|---|---|---|---|
| 3,931,617 | 1/1976 | Russell | 340/173 |
| 4,051,354 | 9/1977 | Choate | 235/312 |
| 4,604,162 | 8/1986 | Sobczak | 156/657 |
| 4,663,831 | 5/1987 | Birrittella et al. | 29/576 E |
| 4,673,962 | 6/1987 | Chatterjee et al. | 357/23.6 |
| 4,677,589 | 6/1987 | Haskell et al. | 365/149 |
| 4,761,768 | 8/1988 | Turner et al. | 365/201 |
| 4,766,569 | 8/1988 | Turner et al. | 365/185 |
| 4,920,065 | 4/1990 | Chin et al. | 437/52 |
| 4,958,318 | 9/1990 | Harari | 365/149 |
| 4,987,089 | 1/1991 | Roberts | 437/34 |
| 5,001,526 | 3/1991 | Gotou | 257/302 |
| 5,006,909 | 4/1991 | Kosa | 357/23.6 |
| 5,017,504 | 5/1991 | Nishimuro et al. | 437/40 |
| 5,021,355 | 6/1991 | Dhong et al. | 437/35 |
| 5,028,977 | 7/1991 | Kenneth et al. | 357/43 |
| 5,057,896 | 10/1991 | Gotou | 357/49 |
| 5,072,269 | 12/1991 | Hieda | 357/23.6 |
| 5,102,817 | 4/1992 | Chatterjee et al. | 437/47 |
| 5,110,752 | 5/1992 | Lu | 437/47 |
| 5,156,987 | 10/1992 | Sandhu et al. | 437/40 |
| 5,177,028 | 1/1993 | Manning | 437/41 |
| 5,177,576 | 1/1993 | Kimura et al. | 257/71 |
| 5,202,278 | 4/1993 | Mathews et al. | 437/47 |
| 5,208,657 | 5/1993 | Chatterjee et al. | 257/302 |
| 5,216,266 | 6/1993 | Ozaki | 257/302 |
| 5,223,081 | 6/1993 | Doan | 156/628 |
| 5,266,514 | 11/1993 | Tuan et al. | 437/52 |
| 5,316,962 | 5/1994 | Matsuo et al. | 437/52 |
| 5,320,880 | 6/1994 | Sandhu et al. | 427/578 |
| 5,327,380 | 7/1994 | Kersh, III et al. | 365/195 |
| 5,329,481 | 7/1994 | Seevinck et al. | 365/177 |

(List continued on next page.)

FOREIGN PATENT DOCUMENTS 363066963A 3/1988 Japan ..................... 257/305

OTHER PUBLICATIONS

Blalock, T.N., et al., "A High–Speed Sensing Scheme for 1T Dynamic RAM's Utilizing the Clamped Bit–Line Sense Amplifier", *IEEE Journal of Solid–State Circuits*, 27, 618–625, (Apr. 1992).

Stellwag, T.B., et al., "A Vertically–Integrated GaAs Bipolar DRAM Cell", *IEEE Transactions on Electron Devices*, 38, 2704–2705, (Dec. 1991).

Adler, E., et al., "The Evolution of IBM CMOS DRAM Technology", *IBM Journal of Research and Development*, 39, 167–188, (Jan./Mar., 1995).

(List continued on next page.)

*Primary Examiner*—Olik Chaudhuri
*Assistant Examiner*—Phat X. Cao
*Attorney, Agent, or Firm*—Schwegman, Lundberg, Woessner & Kluth, P.A.

[57] ABSTRACT

A memory device is described which has an n-channel field effect transistor coupled between a memory cell and a data communication line. An NPN bipolar junction transistor is also coupled between the memory cell and the data communication line in parallel to the n-channel access transistor. A base connection of the NPN bipolar junction transistor is described as coupled to a body of the n-channel access transistor. During operation the n-channel field effect transistor is used for writing data to a memory cell, while the NPN bipolar junction transistor is used for read operations in conjunction with a current sense amplifier circuit. The access transistors are described as fabricated as a single vertical pillar.

19 Claims, 4 Drawing Sheets

U.S. PATENT DOCUMENTS

| | | | |
|---|---|---|---|
| 5,341,331 | 8/1994 | Jeon | 365/189.01 |
| 5,376,575 | 12/1994 | Kim et al. | 437/52 |
| 5,391,911 | 2/1995 | Beyer et al. | 257/522 |
| 5,392,245 | 2/1995 | Manning | 365/200 |
| 5,393,704 | 2/1995 | Huang et al. | 437/203 |
| 5,396,093 | 3/1995 | Lu | 257/306 |
| 5,410,169 | 4/1995 | Yamamoto et al. | 257/301 |
| 5,414,287 | 5/1995 | Hong | 257/316 |
| 5,422,499 | 6/1995 | Manning | 257/67 |
| 5,427,972 | 6/1995 | Shimizu et al. | 437/52 |
| 5,432,739 | 7/1995 | Pein | 365/185 |
| 5,438,009 | 8/1995 | Yang et al. | 437/52 |
| 5,440,158 | 8/1995 | Sung-Mu | 257/314 |
| 5,445,986 | 8/1995 | Hirota | 437/60 |
| 5,460,316 | 10/1995 | Hefele | 228/39 |
| 5,460,988 | 10/1995 | Hong | 437/43 |
| 5,466,625 | 11/1995 | Hsieh et al. | 437/52 |
| 5,483,094 | 1/1996 | Sharma et al. | 257/316 |
| 5,483,487 | 1/1996 | Sung-Mu | 365/185.33 |
| 5,492,853 | 2/1996 | Jeng et al. | 437/60 |
| 5,495,441 | 2/1996 | Hong | 365/185.01 |
| 5,497,017 | 3/1996 | Gonzales | 257/306 |
| 5,504,357 | 4/1996 | Kim et al. | 257/306 |
| 5,508,219 | 4/1996 | Bronner et al. | 437/52 |
| 5,508,542 | 4/1996 | Geiss et al. | 257/301 |
| 5,519,236 | 5/1996 | Ozaki | 257/302 |
| 5,528,062 | 6/1996 | Hsieh et al. | 257/298 |
| 5,563,083 | 10/1996 | Pein | 437/43 |
| 5,574,299 | 11/1996 | Kim | 257/296 |
| 5,593,912 | 1/1997 | Rajeevakumar | 437/52 |
| 5,616,934 | 4/1997 | Dennison et al. | 257/67 |
| 5,640,342 | 6/1997 | Gonzalez | 365/156 |
| 5,644,540 | 7/1997 | Manning | 365/200 |
| 5,646,900 | 7/1997 | Tsukude et al. | 365/205 |
| 5,691,230 | 11/1997 | Forbes | 437/62 |
| 5,705,415 | 1/1998 | Orlowski et al. | 437/43 |
| 5,834,814 | 11/1998 | Ito | 257/378 |
| 5,907,170 | 5/1999 | Forbes et al. | 257/296 |

OTHER PUBLICATIONS

Asai, S., et al., "Technology Challenges for Integration Near and Below 0.1 μm", *Proceedings of the IEEE*, 85, Special Issue on Nanometer–Scale Science & Technology, 505–520, (Apr. 1997).

Banerjee, S.K., et al., "Characterization of Trench Transistors for 3–D Memories", *1986 Symposium on VLSI Technology, Digest of Technical Papers*, San Diego, CA, 79–80, (May 28–30, 1986).

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 4–7, 1994).

Burnett, D., et al., "Statistical Threshold–Voltage Variation and its Impact on Supply–Voltage Scaling", *Proceedings SPIE: Microelectronic Device and Multilevel Interconnection Technology*, 2636, 83–90, (1995).

Chen, M.J., et al., "Back–Gate Forward Bias Method for Low–Voltage CMOS Digital Circuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", *Proceedings of the 1996 IEEE International SOI Conference*, Sanibel Island, FL, 20–21, (Sep. 30–Oct. 3, 1996).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17, 509–511, (Nov. 1996).

Fong, Y., et al., "Oxides Grown on Textured Single–Crystal Silicon—Dependence on Process and Application in EEPROMs", *IEEE Transactions on Electron Devices*, 37, 583–590, (Mar. 1990).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Gong, S., et al., "Techniques for Reducing Switching Noise in High Speed Digital Systems", *Proceedings of the 8th Annual IEEE International ASIC Conference and Exhibit*, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Hisamoto, D., et al., "A New Stacked Cell Structure for Giga–Bit DRAMs using Vertical Ultra–Thin SOI (Delta) MOSFETs", *1991 IEEE International Electron Devices Meeting, Technical Digest*, Washington, D.C., 959–961, (Dec. 8–11, 1991).

Hodges, D.A., et al., "MOS Decoders", In: *Analysis and Design of Digital Integrated Circuits, 2nd Edition*, McGraw–Hill Book Co., New York, 354–357, (1988).

Holman, W.T., et al., "A Compact Low Noise Operational Amplifier for a 1.2 μm Digital CMOS Technology", *IEEE Journal of Solid–State Circuits*, 30, 710–714, (Jun. 1995).

Hu, G., et al., "Will Flash Memory Replace Hard Disk Drive?", *1994 IEEE International Electron Device Meeting*, Panel Discussion, Session 24, Outline 1 p., (Dec. 13, 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm$^2$ 3.3–V Only 128–Mb Multilevel NAND Flash Memory for Mass Storage Applications", *IEEE Journal of Solid–State Circuits*, 31, 1575–1582, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", In: *Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Kohyama, Y., et al., "Buried Bit–Line Cell for 64MB DRAMs", *1990 Symposium on VLSI Technology, Digest of Technical Papers,* Honolulu, HI, 17–18, (Jun. 4–7, 1990).

Koshida, N., et al., "Efficient Visible Photoluminescence from Porous Silicon", *Japanese Journal of Applied Physics,* 30, L1221–L1223, (Jul. 1991).

Kuge, S., et al., "SOI–DRAM Circuit Technologies for Low Power High Speed Multigiga Scale Memories", *IEEE Journal of Solid–State Circuits,* 31, 586–591, (Apr. 1996).

Lantz, II, L., "Soft Errors Induced By Alpha Particles", *IEEE Transactions on Reliability,* 45, 174–179, (Jun. 1996).

Lehmann, V., "The Physics of Macropore Formation in Low Doped n–Type Silicon", *J. Electrochem. Soc.,* 140, 2836–2843, (Oct. 1993).

Lu, N., et al., "The SPT Cell—A New Substrate–Plate Trench Cell for DRAMs", *1985 IEEE International Electron Devices Meeting, Technical Digest,* Washington, D.C., 771–772, (Dec. 1–4, 1985).

MacSweeney, D., et al., "Modelling of Lateral Bipolar Devices in a CMOS Process", *IEEE Bipolar Circuits and Technology Meeting,* Minneapolis, MN, 27–30, (Sep. 1996).

Maeda, S., et al., "A Vertical Φ–Shape Transistor (VΦT) Cell for 1 Gbit DRAM and Beyond", *1994 Symposium of VLSI Technology, Digest of Technical Papers,* Honolulu, HI, 133–134, (Jun. 7–9, 1994).

Maeda, S., et al., "Impact of a Vertical Φ–Shape Transistor (VΦT) Cell for 1 Gbit DRAM and Beyond", *IEEE Transactions on Electron Devices,* 42, 2117–2123, (Dec. 1995).

Malaviya, S., *IBM TBD,* 15, p. 42, (Jul. 1972).

Nitayama, A., et al., "High Speed and Compact CMOS Circuits with Multipillar Surrounding Gate Transistors", *IEEE Transactions on Electron Devices,* 36, 2605–2606, (Nov. 1989).

Ohno, Y., et al., "Estimation of the Charge Collection for the Soft–Error Immunity by the 3D–Device Simulation and the Quantitative Investigation", *Simulation of Semiconductor Devices and Processes,* 6, 302–305, (Sep. 1995).

Oowaki, Y., et al., "New α–Particle Induced Soft Error Mechanism in a Three Dimensional Capacitor Cell", *IEICE Transactions on Electronics,* 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics,* 76–C, 1604–1610, (Nov. 1993).

Ozaki, T., et al., "A Surrounding Isolation–Merged Plate Electrode (Simple) Cell with Checkered Layout for 256Mbit DRAMs and Beyond", *1991 IEEE International Electron Devices Meeting,* Washington, D.C., 469–472, (Dec. 8–11, 1991).

Parke, S.A., et al., "A High–Performance Lateral Bipolar Transistor Fabricated on SIMOX", *IEEE Electron Device Letters,* 14, 33–35, (Jan. 1993).

Pein, H., et al., "A 3–D Sidewall Flash EPROM Cell and Memory Array", *IEEE Transactions on Electron Devices,* 40, 2126–2127, (Nov. 1993).

Pein, H., et al., "Performance of the 3–D Pencil Flash EPROM Cell and Memory Array", *IEEE Transactions on Electron Devices,* 42, 1982–1991, (Nov., 1995).

Pein, H.B., et al., "Performance of the 3–D Sidewall Flash EPROM Cell", *IEEE International Electron Devices Meeting, Technical Digest,* 11–14, (1993).

Rao, K.V., et al., "Trench Capacitor Design Issues in VLSI DRAM Cells", *1986 IEEE International Electron Devices Meeting, Technical Digest,* Los Angeles, CA, 140–143, (Dec. 7–10, 1986).

Richardson, W.F., et al., "A Trench Transistor Cross–Point DRAM Cell", *1985 IEEE International Electron Devices Meeting,* Washington, D.C., 714–717, (Dec. 1–4, 1985).

Sagara, K., et al., "A 0.72 $\mu m^2$ Recessed STC (RSTC) Technology for 256Mbit DRAMs using Quarter–Micron Phase–Shift Lithography", *1992 Symposium on VLSI Technology, Digest of Technical Papers,* Seattle, WA, 10–11, (Jun. 2–4, 1992).

Saito, M., et al., "Technique for Controlling Effective Vth in Multi–Gbit DRAM Sense Amplifier", *1996 Symposium on VLSI Circuits, Digest of Technical Papers,* Honolulu, HI, 106–107, (Jun. 13–15, 1996).

Shah, A.H., et al., "A 4–Mbit DRAM with Trench–Transistor Cell", *IEEE Journal of Solid–State Circuits,* SC–21, 618–625, (Oct. 1986).

Shah, A.H., et al., "A 4Mb DRAM with Cross–Point Trench Transistor Cell", *1986 IEEE International Solid–State Circuits Conference, Digest of Technical Papers,* 268–269, (Feb. 21, 1986).

Sherony, M.J., et al., "Reduction of Threshold Voltage Sensitivity in SOI MOSFET's", *IEEE Electron Device Letters,* 16, 100–102, (Mar. 1995).

Shimomura, K., et al., "A IV 46ns 16Mb SOI–DRAM with Body Control Technique", *1997 IEEE International Solid–State Circuits Conference, Digest of Technical Papers,* 68–69, (Feb. 6, 1997).

Suma, K., et al., "An SOI–DRAM with Wide Operating Voltage Range by CMOS/SIMOX Technology", *IEEE Journal of Solid–State Circuits,* 29, 1323–1329, (Nov. 1994).

Sunouchi, K., et al., "A Surrounding Gate Transistor (SGT) Cell for 64/256Mbit DRAMs", *1989 IEEE International Electron Devices Meeting, Technical Digest,* Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting,* San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research,* B–99, Proceedings of the 13th International Conference on the Application of Accelerators in Research and Industry, Denton, TX, 562–565, (Nov. 7–10, 1994).

Takato, H., et al., "High Performance CMOS Surrounding Gate Transistor (SGT) for Ultra High Density LSIs", *1998 IEEE International Electron Devices Meeting, Technical Digest,* 222–225, (1988).

Takato, H., et al., "Impact of Surrounding Gate Transistor (SGT) for Ultra–High Density LSI's", *IEEE Transactions on Electron Devices,* 38, 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers,* Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers,* Oiso, 13–14, (May 28–30, 1991).

Terauchi, M., et al., "A Surrounding Gate Transistor (SGT) Gain Cell for Ultra High Density DRAMs", *1993 Symposium on VLSI Technology, Digest of Technical Papers,* Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices,* 42, 564–570, (Mar. 1995).

Verdonckt–Vandebroek, S., et al., "High–Gain Lateral Bipolar Action in a MOSFET Structure", *IEEE Transactions on Electron Devices,* 38, 2487–2496, (Nov. 1991).

Wang, N., *Digital MOS Integrated Circuits,* Prentice Hall, Inc., Englewood Cliffs, NJ, p. 328–333, (1989).

Wang, P.W., et al., "Excellent Emission Characteristics of Tunneling Oxides Formed Using Ultrathin Silicon Films for Flash Memory Devices", *Japanese Journal of Applied Physics,* 35, 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest,* San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers,* Kyoto, Japan, 17–18, (1993).

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials,* Yokohama, Japan, 478–480, (1991).

Watanabe, H., et al., "Device Application and Structure Observation for Hemispherical–Grained Si", *J. Appl. Phys.,* 71, 3538–3543, (Apr. 1992).

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials,* Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits,* 30, 960–971, (Sep. 1995).

Yamada, T., et al., "A New Cell Structure with a Spread Source/Drain (SSD) MOSFET and a Cylindrical Capacitor for 64–Mb DRAM's", *IEEE Transactions on Electron Devices,* 38, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest,* Washington, D.C., 35–38, (Dec. 3–6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers,* Honolulu, HI, 240–241, (Jun. 11–13, 1996).

CIRCUITS AND METHODS FOR A MEMORY CELL WITH A TRENCH PLATE TRENCH CAPACITOR AND A VERTICAL BIPOLAR READ DEVICE

RELATED APPLICATIONS

This application is related to the following co-pending, commonly assigned applications which are incorporated by reference:

U.S. application Ser. No. 09/028,249 entitled "VERTICAL BIPOLAR READ ACCESS FOR LOW VOLTAGE MEMORY CELL,"

U.S. application Ser. No. 08/944,312 entitled "CIRCUIT AND METHOD FOR A FOLDED BIT LINE MEMORY USING TRENCH PLATE CAPACITOR CELLS WITH BODY BIAS CONTACTS,"

U.S. application Ser. No. 08/939,732, entitled "CIRCUIT AND METHOD FOR AN OPEN BIT LINE MEMORY CELL WITH A VERTICAL TRANSISTOR AND TRENCH PLATE TRENCH CAPACITOR,"

U.S. application Ser. No. 08/939,742, entitled "CIRCUIT AND METHOD FOR A FOLDED BIT LINE MEMORY CELL WITH VERTICAL TRANSISTOR AND TRENCH CAPACITOR," and U.S. application Ser. No. 08/944,890, entitled "CIRCUIT AND METHOD FOR AN OPEN BIT LINE MEMORY CELL WITH A VERTICAL TRANSISTOR AND TRENCH PLATE TRENCH CAPACITOR."

TECHNICAL FIELD OF THE INVENTION

The present invention relates generally to integrated circuits and in particular the present invention relates to integrated circuit memory devices.

BACKGROUND OF THE INVENTION

Complimentary metal oxide semiconductor field effect transistors (CMOS FETs) are prevalent in integrated circuit technology because they generally demand less power than bipolar transistors. Threshold voltage variations of CMOS transistors, however, are beginning to pose impractical limitations on CMOS devices as power supply voltages are reduced. In a 0.2 micron CMOS technology a 0.4 V distribution in threshold voltages might be anticipated. With a one volt power supply, this distribution can cause large variations in the speed of a logic circuit, such as those used in integrated memory circuits. For example, a threshold voltage of 0.6 V is required in a DRAM memory cell access transistor to insure low sub-threshold voltage leakage currents. If a threshold voltage distribution of 0.4 volts is experienced, there will be instances where little or no excess voltage above threshold voltage is available. As such, data transfer from a memory cell via such a transistor will be very slow.

A basic problem with CMOS access transistors results from the fact that CMOS devices do not function well at low voltages and require the use of higher than desirable power supply voltages, currently around two volts in 0.2 micron CMOS technology. Various techniques have been proposed to compensate for this in CMOS technology. For example, some form of transistor forward body bias, or specialized circuits to compensate for threshold voltage variations can be used.

Various types of lateral MOS transistors have been described and utilized in CMOS technology. Lateral bipolar transistors have received renewed interest with the advent of bipolar complementary metal oxide semiconductor (BiCMOS) technologies.

For the reasons stated above, and for other reasons stated below which will become apparent to those skilled in the art upon reading and understanding the present specification, there is a need in the art for an access device for use in a low voltage memory device which performs fast read access of memory data.

SUMMARY OF THE INVENTION

The above mentioned problems with integrated circuit memory devices and other problems are addressed by the present invention and which will be understood by reading and studying the following specification. A memory cell access device is described which uses a combination of bipolar junction and CMOS transistors as access devices to store and read data on a trench plate trench capacitor.

In particular, one embodiment of the present invention provides a memory cell access device that has two access transistors. The first access transistor is an n-channel field effect transistor (FET) that is coupled between a trench plate trench capacitor and a data communication line. The second access transistor is an NPN bipolar junction transistor that is coupled between the trench plate trench capacitor and the data communication line. The n-channel access transistor and the NPN bipolar junction transistor are connected in parallel, and a base connection of the NPN bipolar junction transistor is coupled to a body of the n-channel field effect transistor.

In another embodiment, a low voltage memory cell access device fabricated as a vertical pillar structure is provided. The memory cell access device includes a field effect transistor that is coupled between a trench plate trench capacitor and a data communication line. The memory cell access device also includes a bipolar junction transistor that is coupled between the memory cell and the data communication line. The field effect transistor and the bipolar junction transistor are connected in parallel, with a base connection of the bipolar junction transistor that is coupled to a body of the field effect transistor.

In another embodiment, a memory device having a low voltage supply is provided. The memory device comprises a plurality of memory cells, a plurality of data communication bit lines, and a plurality of memory cell access devices coupled between the plurality of memory cells and the plurality of data communication bit lines. Each of the plurality of memory cell access devices comprises a field effect transistor and a bipolar junction transistor. The field effect transistor and the bipolar junction transistor are connected in parallel between a trench plate trench capacitor and a data communication bit line.

In another embodiment, a method of accessing a memory cell is provided. The method includes activating a field effect transistor coupled between a trench plate trench capacitor and a data communication line for writing data to the memory cell, and activating a bipolar junction transistor coupled between the trench plate trench capacitor and a data communication line for reading a charge stored on the memory cell.

DETAILED DESCRIPTION

Figure 1:
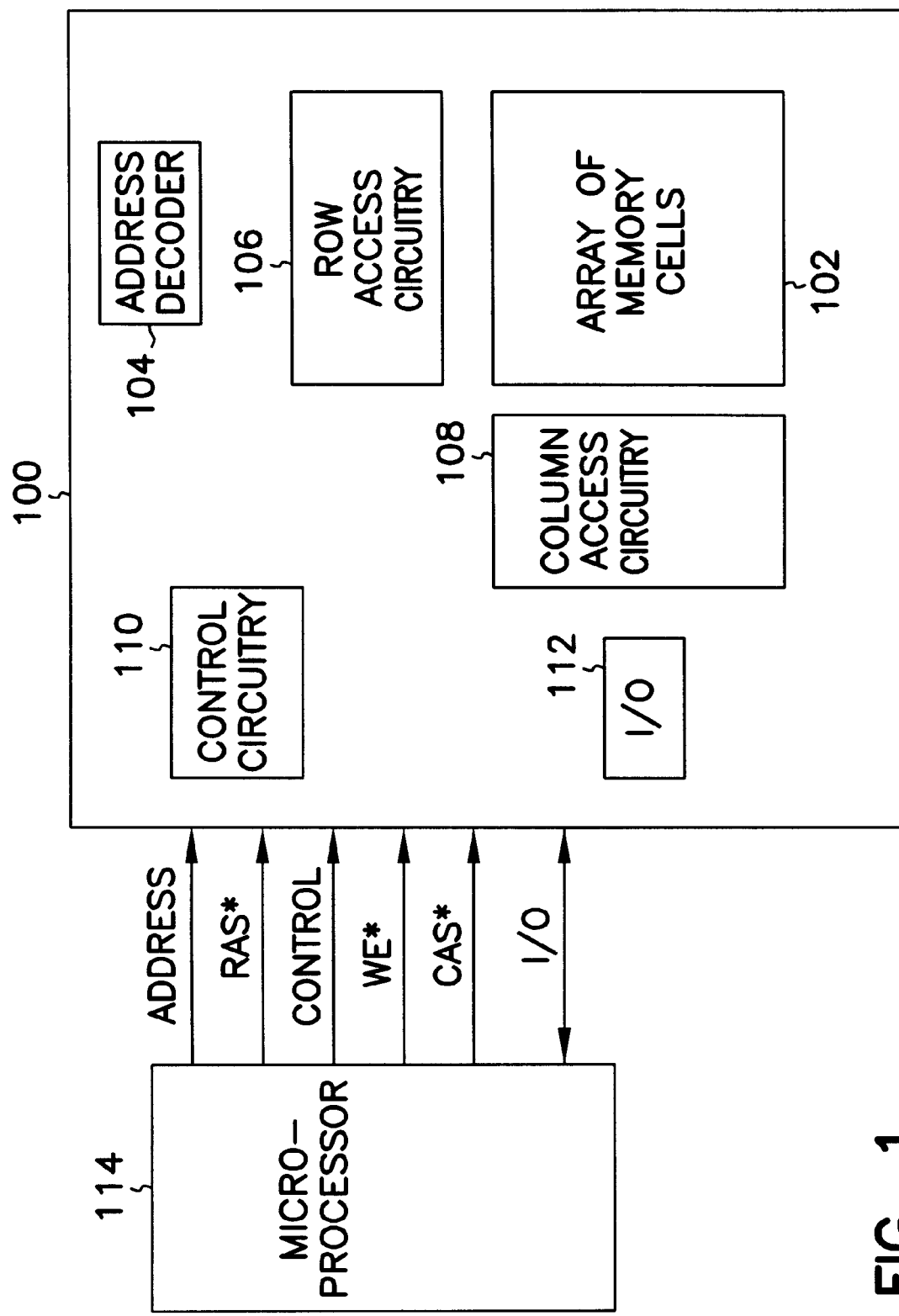
FIG. 1 is a block diagram of an embodiment of a memory device according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Smaller integrated circuit devices combined with the development of vertical integrated circuit structures, make it possible to use bipolar junction transistor action rather than just field effect transistor operation. In fact, a bipolar junction transistor structure can be used as a data read access device and a field effect transistor used as a data write access device, as described herein. Below, an embodiment of the present invention is described in terms of a dynamic random access memory (DRAM) device. Embodiments of an access device constructed according to the teachings of the present invention are also shown and described. It is understood, however, that these embodiments are provided by way of example and not by way of limitation.

Dram Device

FIG. 1 is a simplified block diagram of an embodiment of a memory device incorporating access devices constructed according to the teachings of the present invention. Memory device 100 includes an array of memory cells 102, address decoder 104, row access circuitry 106, column access circuitry 108, control circuitry 110, and Input/Output circuit (I/O) 112.

In one embodiment, each cell in array 102 includes an access device with a bipolar junction transistor coupled in parallel with a field effect transistor between a data communication or digit line and a trench plate trench capacitor. The access device is used to charge and discharge the trench plate trench capacitor to store and read data from the memory cell. The field effect transistor charges the capacitor. The bipolar junction transistor reads the charge stored on the capacitor by discharging the capacitor and providing the current to a current sense amplifier. The bipolar junction transistor typically conducts a higher current compared to its counterpart field effect transistor. Thus, the access device provides the advantage of increased speed in reading the data stored in the memory cell by allowing the capacitor to be discharged more quickly.

Memory device 100 can be coupled to an external microprocessor 114, or memory controller for memory accessing. Memory device 100 receives control signals from the microprocessor 114, such as WE*, RAS* and CAS* signals. Memory device 100 is used to store data which is accessed via I/O lines. It will be appreciated by those skilled in the art that additional circuitry and control signals can be provided, and that the memory device of FIG. 1 has been simplified to help focus on embodiments of the present invention.

It will be understood that the above description of a DRAM is intended to provide a general understanding of the memory and is not a complete description of all the elements and features of a DRAM. Further, the embodiments of the present invention are equally applicable to any size and type of memory circuit and are not intended to be limited to the DRAM described above. Other alternative types of devices include SRAM or Flash memories. Additionally, the DRAM could be a synchronous DRAM commonly referred to as SGRAM, SDRAM, SDRAM II, and DDR SDRAM, as well as Synchlink or Rambus DRAMs.

Figure 2:
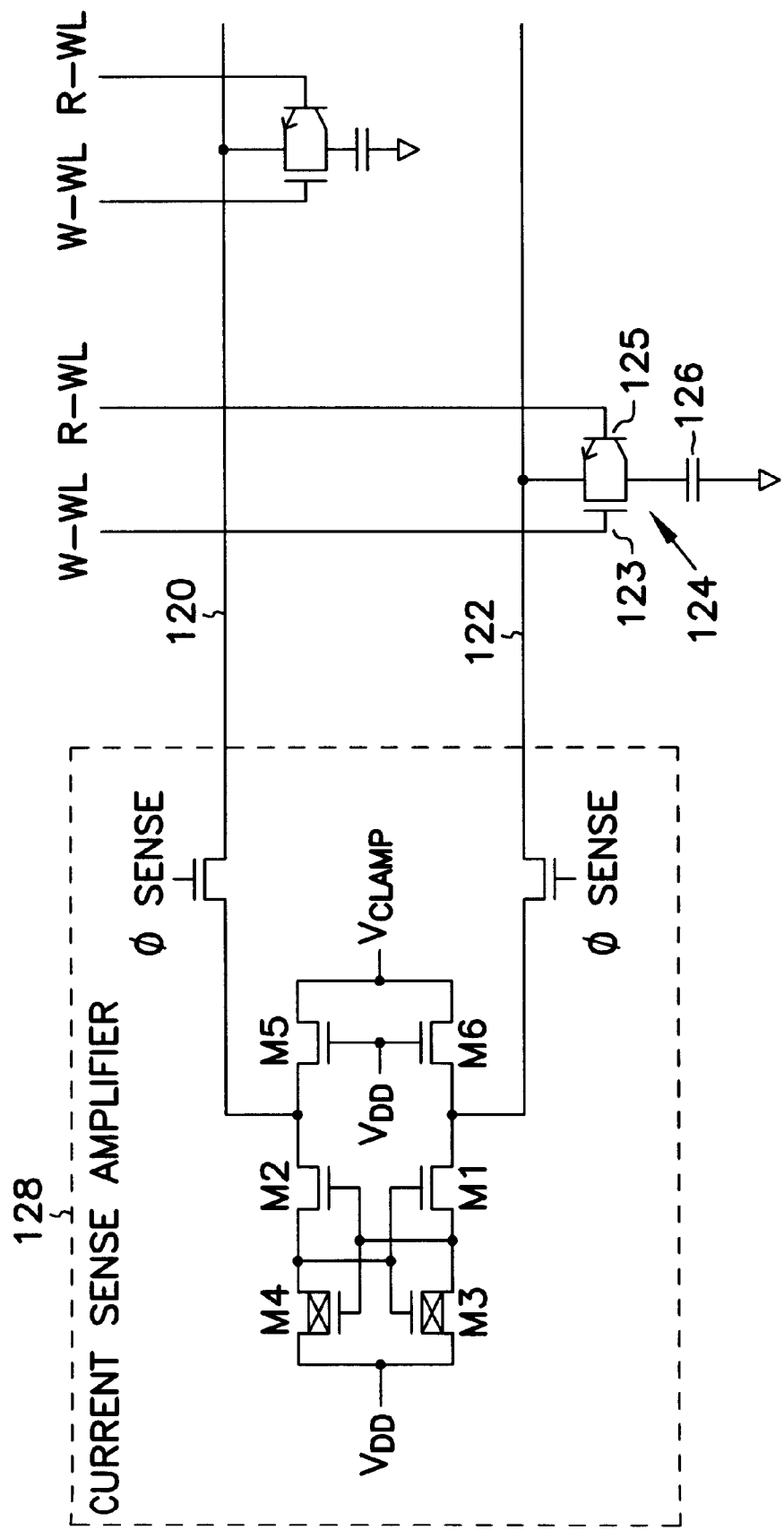
FIG. 2 is an embodiment of a portion of an array of memory cells according to the teachings of the present invention.

Referring to FIG. 2, an embodiment of a portion of array 102 is provided. The simplified schematic diagram illustrates a portion of a column of the array 102. The column is generally defined by a pair of data communication or digit lines 120 and 122. Access devices 124 are located along the digit lines for coupling trench plate trench capacitors 126 to a digit line. Access devices 124 include field effect transistor 123 in parallel with bipolar junction transistor 125. The field effect transistors 123 are activated by a word line (W-WL) to write data to a trench plate trench capacitor, which defines a row of the memory array. The bipolar junction transistors 125 are activated by a word line (R-WL) to read data from a trench plate trench capacitor.

Current sense amplifier 128 is provided to detect current signals provided to the digit lines by a bipolar junction transistor during a read operation. In one embodiment, a clamped bit line sense amplifier, as shown, can be used. The current from the digit lines are injected to the cross coupled pair of inverters (M1/M3 and M2/M4). Transistors M5 and M6 serve to clamp the digit lines at a fixed voltage, e.g., 0.7 volts. The impedance looking into the source of transistors M1 and M2 is very low but the current injected here from the data lines serves to upset the cross coupled inverters which provides a high speed large signal output. Alternatively, other sense amplifiers can be used that allow a current from a trench plate trench capacitor to be sensed.

As described above, a large variation in a threshold voltage of the field effect access transistors can result in slow data access. This slow access is most troubling in data read operations. Embodiments of the present invention avoid this access speed problem while maintaining a higher threshold voltage. That is, for access devices 124 in a DRAM circuit a larger threshold voltage value is desired to reduce memory cell leakage and increase retention time in the memory cells. By using the bipolar junction transistor in parallel with the field effect transistor, a larger threshold voltage can be maintained without increasing cell leakage and reducing retention time.

Memory Cell Access Device

Figure 3A:
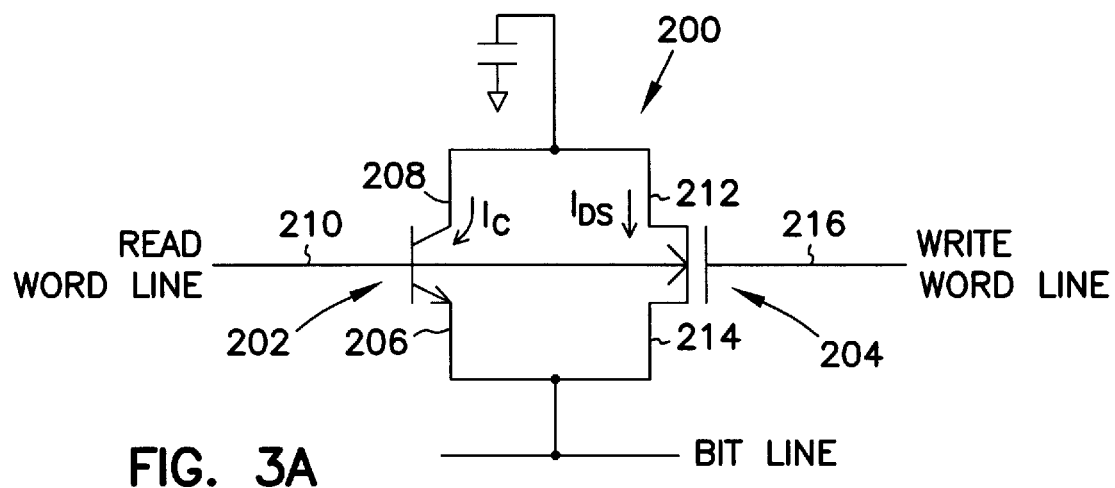
FIG. 3A is a schematic diagram that illustrates an embodiment of a memory cell with a vertical access device according to the teachings of the present invention.

FIG. 3A illustrates a schematic diagram of a vertical access device 200 having both a bipolar junction transistor 202 and a metal-oxide semiconductor field effect transistor (MOSFET) 204 which can be formed in either bulk or SOI technology. Bipolar junction transistor 202 is an NPN transistor having emitter 206, collector 208 and base 210. Transistor 204 is an n-channel MOSFET having first source/drain region 212, second source/drain region 214 and gate 216. The access device can be fabricated as a single unit, or as separate transistors.

Figure 3B:
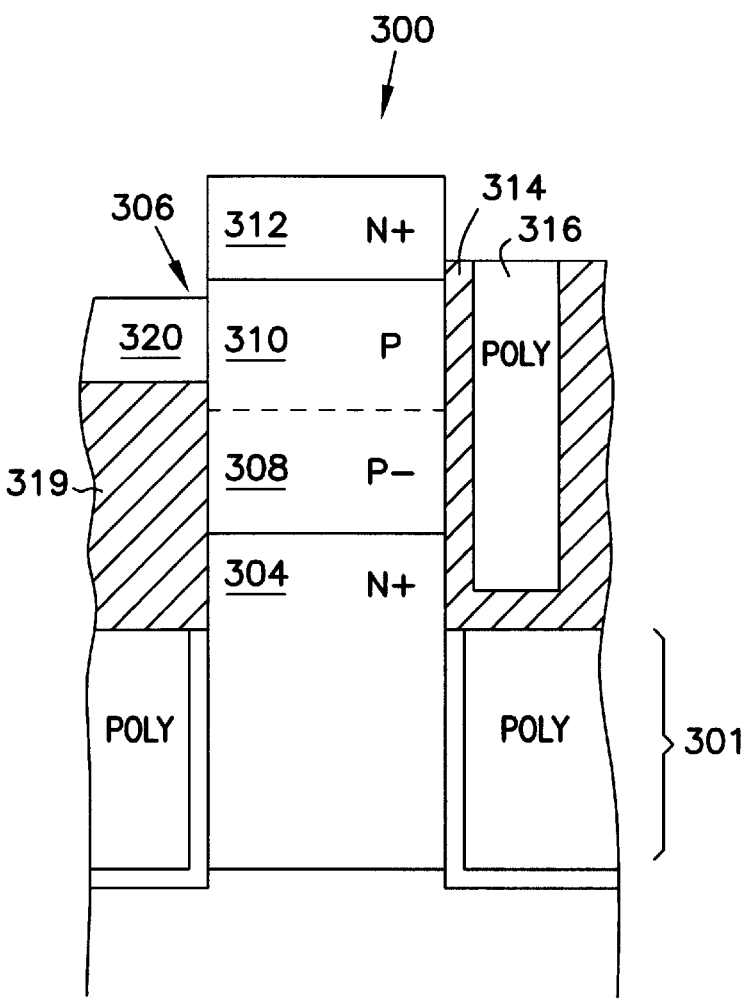
FIG. 3B is a cross sectional view that illustrates an integrated circuit embodiment of the vertical access device of FIG. 3A.
Figure 3C:
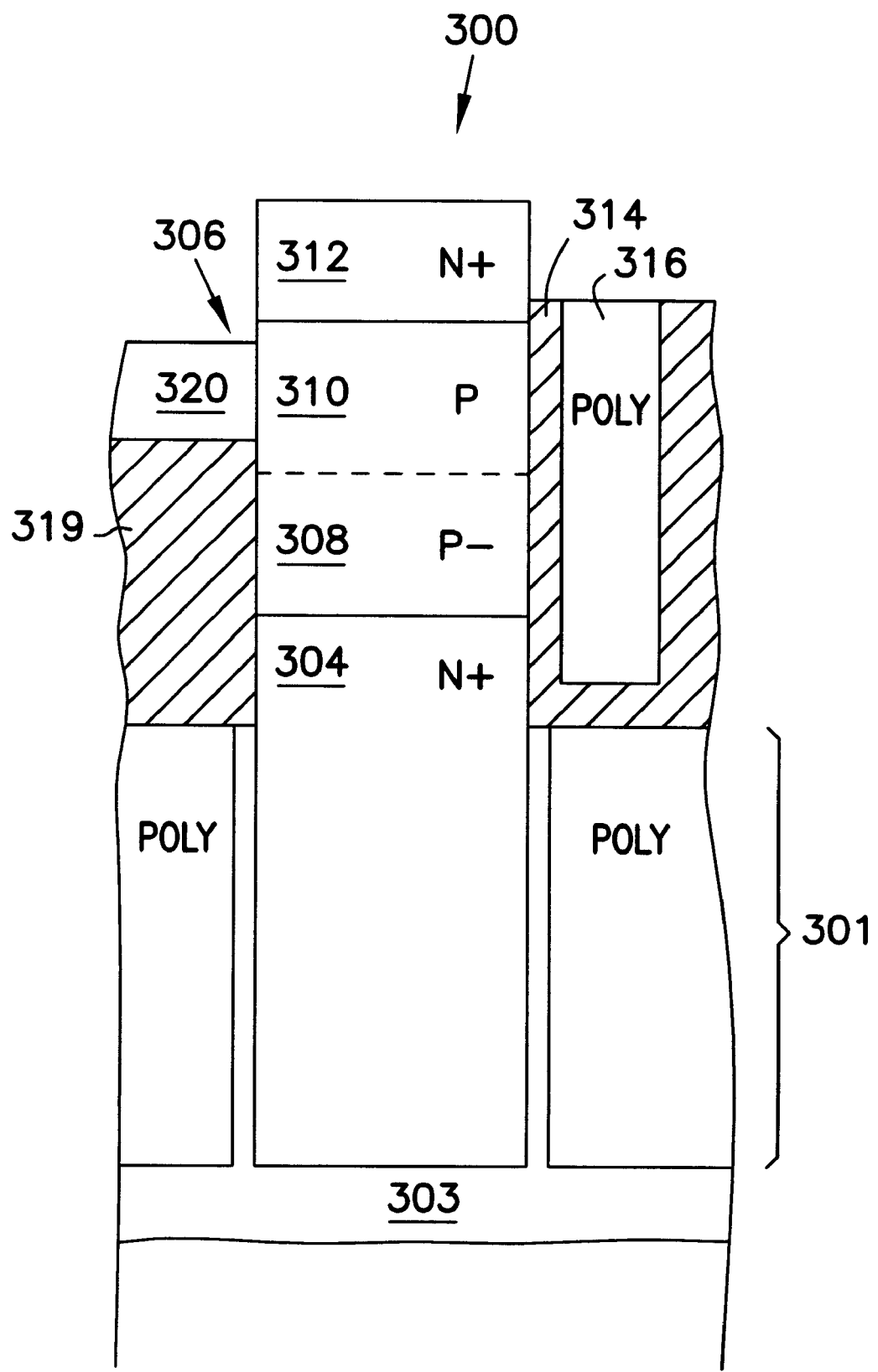
FIG. 3C is a cross sectional view that illustrates another integrated circuit embodiment of the vertical access device of FIG. 3A.

FIG. 3B and 3C provide alternative fabricated integrated circuit embodiments of an access device 300 constructed according to the teachings of the present invention. FIG. 3B is a bulk silicon embodiment of an access device formed in a single pillar of monocrystalline semiconductor material. Access device 300 includes a parallel combination of a bipolar junction transistor and a field effect transistor. Access device 300 is coupled to trench plate trench capacitor 301. Access device 300 includes n+ semiconductor layer 304. Layer 304 serves as an emitter for the bipolar junction transistor, a source/drain region for the field effect transistor and a plate of the trench plate trench capacitor. P-doped semiconductor layer 306 is fabricated on layer 304. The vertical doping profile of region 306 is varied, as explained below, to optimize bipolar transistor action. An n+ semiconductor layer 312 is provided on top of layer 306. Polysilicon region 316 is fabricated to operate as a gate isolated from layer 306 by gate oxide layer 314. A polysilicon base contact 320 is provided opposite gate 316 on oxide layer 319 and in contact with region 306. Further, trench plate trench capacitor 301 includes a polysilicon mesh (POLY) that surrounds a portion of layer 304. The polysilicon mesh forms a second plate of capacitor 301.

FIG. 3C is an SOI embodiment of an access device 300 constructed according to the teachings of the present invention. In this embodiment, access device 300 includes n+ semiconductor layer 304 that extends down through a polysilicon mesh (POLY). The polysilicon mesh and layer 304 are formed on insulator layer 303, e.g., an oxide, or insulating base layer. The remaining components of the access device are substantially the same as the access device of FIG. 3B, although fabrication techniques may differ.

A vertical doping profile of region 306 of the access device is optimized for both bipolar transistor action and biasing the body of the field effect transistor to a value around 0.9 V to forward bias the base emitter junction. The doping profile is controlled so that the top portion 310 of layer 306 is more heavily doped p-type than a bottom region 308. This difference in doping is represented by the designations P and P–. The actual doping levels with respect to other structures or base layers can be varied, and relative doping levels between the top and bottom regions of layer 306 is only represented herein.

One way to create the difference in the doping profile is to use the effects of the fabrication of emitter 312. When the emitter, or top n-type layer 312, is fabricated a relatively higher base doping level near emitter 312 can be created. This doping profile is required in a vertical NPN transistor to give field-aided diffusion in the base and a high current gain, β. If the base doping is around $10^{18}/cm^3$, as is common in NPN transistors, then region 310 also serves to make the n-channel vertical MOSFET enhancement mode, which is difficult to achieve by other techniques since implantations for threshold voltage adjustment cannot be conveniently done.

The following comparison further illustrates the advantage of using a bipolar junction transistor for data read operations in a low voltage memory. If n-channel field effect transistor 204 of FIG. 3A is used to discharge the capacitor, it is customary to precharge a data communication "bit" line to ½ $V_{DD}$, or in this illustration 1.5 volts. The peak transfer current $I_D$ is estimated to be around 40 μA assuming a Vt of 0.5 volts. That is, the drain current is calculated by:

$$I_D = \mu Co\left(\frac{W}{L}\right)\left(\frac{(Vgs - Vt)^2}{2}\right) \quad \text{where } W = L$$

$$I_D = 80\frac{\mu A}{V^2} * 1 * \left(\frac{1}{2}V\right)^2 = 40 \mu A$$

If the memory cell is assumed to store 50 fC, the charge from the memory cell requires 1.2 nano-seconds to transfer to the bit line through transistor 204.

A faster data transfer is possible if bipolar access transistor 202 is used with a clamped bit line where the bit line is precharged to a lower voltage, such as 0.7 V. The peak bipolar current is determined mostly by the base current $I_B$ and the variation of current gain, β, with peak current. Assuming a base current of 4.0 μA, a peak collector value of 400 μA is estimated by:

$$I_C = \beta I_B \text{ where } \beta = 100$$

If the memory cell is assumed to store the 70 fC, the charge from the memory cell requires only 0.18 nano-seconds to transfer to the bit line. A substantial decrease in transfer time, therefore, is experienced by using a bipolar access transistor during read operations in the low voltage memory.

Access Operations in a DRAM Embodiment

During a write operation the base of BJT transistor 202 is coupled to a low voltage, such as 0.7 volts. The body potential in layer 306, therefore, is held at the low level resulting in a MOSFET body bias which increases as the memory is charged due to an elevated bit line potential. As a result, the threshold voltage of transistor 204 rises to around one volt. A bootstrapped voltage as known to those skilled in the art can be used to drive the gate voltage above three volts, such as four volts. This booted voltage is necessary because the supply voltage is limited to three volts, and a second supply is typically not provided. The time required for the write operation is not critical and can be much longer than the read response. Thus, the reduced power requirements of the MOSFET are desirable.

During a read operation the bit lines are clamped to a low voltage (near the base low voltage), in this example 0.7 V. The voltage of the bit lines does not change significantly during a read operation, unlike in a memory using a conventional voltage sense amplifier, since here current not voltage is being sensed. During a read operation, the read word line goes to a higher voltage, such as 1.4 V, to forward bias the base-emitter junction and turn on the bipolar transistor 202. The bipolar transistor will be strongly forward biased and quickly discharge the charge stored on the memory storage capacitor onto the bit line where it can be sensed as a current. The memory cell discharges to about 0.7 V at which point the bipolar transistor saturates and stops functioning. The memory cell data state voltage levels are therefore approximately two volts when charged, and 0.7 V when discharged.

It is estimated that a bit line current sense amplifier is about eight times faster than the a bit line differential voltage sense amplifier commonly used in DRAMs. Further, as detailed above, current transfer from a memory cell to a bit line using the bipolar transfer device is about eight times faster than an n-channel MOSFET transfer device. The net result is that the present invention, when used in a low voltage memory device for data read operations, is about eight times faster than commonly used CMOS DRAMs. Further, a vertical access transistor device with a trench plate trench capacitor is only 4 F$^2$ in area. A DRAM according to the present invention, therefore, is about one-half the area of conventional DRAM's and about eight times faster.

In operation, the bipolar device would be used for reads and the MOSFET device on the other side of the device pillar can most conveniently be used for write operations to store information on the memory capacitor in a conventional manner. The present invention can be scaled to lower power supply voltages and smaller dimensions, in which case the use of the bipolar access device becomes yet more advantageous. For one volt power supply voltages, the threshold voltage variations of MOSFETs will become a large fraction of the total voltage available.

Conclusion

Embodiments of an access device for a memory device have been described which use an n-channel field effect transistor and a bipolar junction transistor coupled in parallel between a trench plate trench capacitor and a data communication line. A base connection of the NPN bipolar junction transistor has been described as coupled to a body of the n-channel access transistor to control threshold voltage variations of the n-channel field effect transistor. During operation the n-channel field effect transistor is used for writing data to a trench plate trench capacitor, while the NPN bipolar junction transistor is used for read operations in conjunction with a current sense amplifier circuit. The access transistors are described as fabricated as a single vertical pillar.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention.

What is claimed is:

1. A memory cell access device comprising:
   an n-channel field effect transistor coupled between a trench plate trench capacitor and a data communication line; and
   an NPN bipolar junction transistor coupled between the trench plate trench capacitor and the data communication line, wherein the NPN bipolar junction transistor provides a current transfer path during read operations, and is cooperatively coupled such that the n-channel transistor and the NPN bipolar junction transistor are connected in parallel, a base connection of the NPN bipolar junction transistor is coupled to a body of the n-channel field effect transistor.

2. The memory cell access device of claim 1, wherein the n-channel field effect transistor and the NPN bipolar junction transistor are fabricated as a single unit.

3. The memory cell access device of claim 2, wherein the single unit comprises:
   a first layer of n-type semiconductor material;
   a p-type semiconductor material fabricated outwardly from the first layer of n-type semiconductor material;
   a gate fabricated adjacent to the p-type semiconductor material and electrically separated by a layer of gate insulation; and
   a second layer of n-type semiconductor material fabricated on top of the p-type semiconductor material, such that the p-type semiconductor material functions as both a body of the n-channel field effect transistor and a base of the NPN bipolar junction transistor.

4. The memory cell access device of claim 3, wherein the p-type semiconductor material has a doping profile such that a top portion of the p-type semiconductor material is more heavily doped than a bottom portion of the p-type semiconductor material.

5. The memory cell access device of claim 3, wherein a portion of the first layer of n-type material functions as one plate of the trench plate trench capacitor.

6. The memory cell access device of claim 5, wherein the portion of the first layer of n-type material that functions as one plate of the trench capacitor is surrounded by a polysilicon mesh that functions as the second plate of the trench plate trench capacitor.

7. A memory cell access device comprising:
   an n-channel field effect transistor coupled between a trench plate trench capacitor and a data communication line;
   an NPN bipolar junction transistor coupled between the trench plate trench capacitor and the data communication line, such that the n-channel transistor and the NPN bipolar junction transistor are connected in parallel, a base connection of the NPN bipolar junction transistor is coupled to a body of the n-channel field effect transistor; and
   wherein the n-channel field effect transistor is used to write date to the memory cell, and the NPN bipolar junction transistor is used to read data from the memory cell.

8. A low voltage memory cell access device fabricated as a vertical pillar structure, the memory cell access device comprising:
   a field effect transistor coupled between a trench plate trench capacitor and a data communication line; and
   a bipolar junction transistor coupled between the trench plate trench capacitor and the data communication line, wherein the bipolar junction transistor provides a current transfer path during read operations, and is cooperatively coupled such that the field effect transistor and the bipolar junction transistor are connected in parallel, a base connection of the bipolar junction transistor is coupled to a body of the field effect transistor.

9. The low voltage memory cell access device of claim 8 wherein the field effect transistor is an n-channel transistor and the bipolar junction transistor is an NPN transistor.

10. The low voltage memory cell access device of claim 9 wherein the field effect transistor and the bipolar junction transistor are fabricated as a common structure comprising:

a first layer of n-type semiconductor material;

a p-type semiconductor material fabricated on top of the first layer of n-type semiconductor material;

a gate fabricated adjacent to the p-type semiconductor material and electrically separated by a layer of gate insulation;

a second layer of n-type semiconductor material fabricated outwardly from the p-type semiconductor material, such that the p-type semiconductor material functions as both a body of the n-channel field effect transistor and a base of the NPN bipolar junction transistor; and a base contact formed adjacent to the p-type semiconductor material on a side opposite the gate.

11. The low voltage memory cell access device of claim 10, wherein the first layer of n-type semiconductor material includes a portion that functions as a first plate of the trench plate trench capacitor.

12. The low voltage memory cell access device of claim 10, and further comprising a first word line coupled to the gate for activating the n-channel transistor, and a second word line coupled to the base contact for activating the NPN bipolar junction transistor.

13. The low voltage memory cell access device of claim 8, wherein the p-type semiconductor material has a doping profile such that a top portion of the p-type semiconductor material is more heavily doped than a bottom portion of the p-type semiconductor material.

14. The low voltage memory cell access device of claim 8, wherein the low voltage memory cell access device is fabricated using a silicon-on-insulator (SOI) construction.

15. The low voltage memory cell access device of claim 8, wherein the low voltage memory cell access device is fabricated in bulk silicon.

16. A memory device having a low voltage supply, the memory device comprising:

a plurality of memory cells;

a plurality of data communication bit lines;

a plurality of memory cell access devices coupled between the plurality of memory cells and the plurality of data communication bit lines, each of the plurality of memory cell access devices comprising:

a field effect transistor, and a bipolar junction transistor, such that the field effect transistor and the bipolar junction access transistor are connected in parallel between the trench plate trench capacitor and a data communication bit line, and a current sense amplifier coupled to the plurality of data communication bit lines, wherein the current sense amplifier detects current signals provided to the data communication bit lines by the bipolar junction transistor during a read operation.

17. The memory device of claim 16, wherein each memory cell access device includes a field effect transistor and a bipolar junction transistor that share a common pillar of semiconductor material.

18. The memory device of claim 16 wherein the memory device is a dynamic random access memory (DRAM).

19. The memory device of claim 16 wherein the field effect transistor is an n-channel transistor and the bipolar junction transistor is an NPN transistor.

* * * * *

UNITED STATES PATENT AND TRADEMARK OFFICE
CERTIFICATE OF CORRECTION

PATENT NO. : 6,043,527
DATED : March 28, 2000
INVENTOR(S) : Forbes

Page 1 of 1

It is certified that error appears in the above-identified patent and that said Letters Patent is hereby corrected as shown below:

Claim 7,
Line 46, please delete "to write date" and replace with -- to write data -- therefore.

Claim 13,
Line 25, please delete "of claim 8" and replace with -- of claim 10 -- therefore.

Claim 16,
Line 14, please delete "the trench" and replace with -- a trench -- therefore.

Signed and Sealed this

Fourth Day of December, 2001

Attest:

*Nicholas P. Godici*

NICHOLAS P. GODICI
*Attesting Officer*     *Acting Director of the United States Patent and Trademark Office*